United States Patent
Yue et al.

(10) Patent No.: US 10,903,910 B2
(45) Date of Patent: Jan. 26, 2021

(54) METHODS AND APPARATUS FOR OPTICAL COMMUNICATIONS VIA PULSE AMPLITUDE MODULATION (PAM) IN DENSE WAVELENGTH-DIVISION MULTIPLEXING (DWDM) SYSTEMS

(71) Applicant: Juniper Networks, Inc., Sunnyvale, CA (US)

(72) Inventors: Yang Yue, Milpitas, CA (US); Qiang Wang, San Carlos, CA (US); Zhen Qu, Sunnyvale, CA (US); Xiao Han, Tuscon, AZ (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/456,761

(22) Filed: Jun. 28, 2019

(65) Prior Publication Data
US 2020/0350994 A1    Nov. 5, 2020

Related U.S. Application Data

(60) Provisional application No. 62/840,619, filed on Apr. 30, 2019.

(51) Int. Cl.
| | |
|---|---|
| *H04B 10/00* | (2013.01) |
| *H04B 10/54* | (2013.01) |
| *H04L 1/00* | (2006.01) |
| *H04J 14/02* | (2006.01) |
| *H04B 10/079* | (2013.01) |
| *H04J 14/00* | (2006.01) |

(52) U.S. Cl.
CPC ..... *H04B 10/541* (2013.01); *H04B 10/07951* (2013.01); *H04B 10/07953* (2013.01); *H04J 14/0227* (2013.01); *H04L 1/0057* (2013.01)

(58) Field of Classification Search
CPC .... H04B 10/50; H04B 10/504; H04B 10/516; H04B 10/524; H04B 10/54; H04B 10/541
See application file for complete search history.

(56) References Cited

U.S. PATENT DOCUMENTS

| | | | |
|---|---|---|---|
| 2015/0023659 A1* | 1/2015 | Sun .................. | H04B 10/616 398/34 |
| 2017/0104544 A1* | 4/2017 | Chung ............... | H04B 10/588 |

FOREIGN PATENT DOCUMENTS

EP    1737134 A2    12/2006

OTHER PUBLICATIONS

Extended European Search Report for European Application No. 19183133.8, dated Dec. 12, 2019, 11 pages.
(Continued)

*Primary Examiner* — Daniel G Dobson
(74) *Attorney, Agent, or Firm* — Cooley LLP

(57) ABSTRACT

A method includes modulating a digital signal via pulse amplitude modulation (PAM) and applying Nyquist shaping to the digital signal to generate a filtered digital signal. The method also includes converting the filtered digital signal into an analog signal and transmitting the analog signal in an optical communication channel via a dense wavelength division multiplexing (DWDM) scheme.

19 Claims, 11 Drawing Sheets

(56) References Cited

OTHER PUBLICATIONS

Kikuchi, N. et al., "Intensity-modulated / direct-detection (IM/DD) nyquist pulse-amplitude modulation (PAM) signaling for 100-Gbit/s$\lambda$ optical short-reach transmission," 2014 The European Conference on Optical Communication (ECOC), Cannes, France, Systematic Paris Region Systems and ICT Cluster, Sep. 21, 2014, pp. 1-3.
Han, X. et al., "Probabilistically shaped 8-PAM suitable for data centers communication," 2018 20th International Conference on Transparent Optical Networks (ICTON), IEEE, Jul. 1, 2018, pp. 1-4.
Bosco, G., "Advanced modulation techniques for flexible optical transceivers: The rate/reach tradeoff," Journal of Lightwave Technology, IEEE, vol. 37, No. 1, Jan. 2019, pp. 36-49.

* cited by examiner

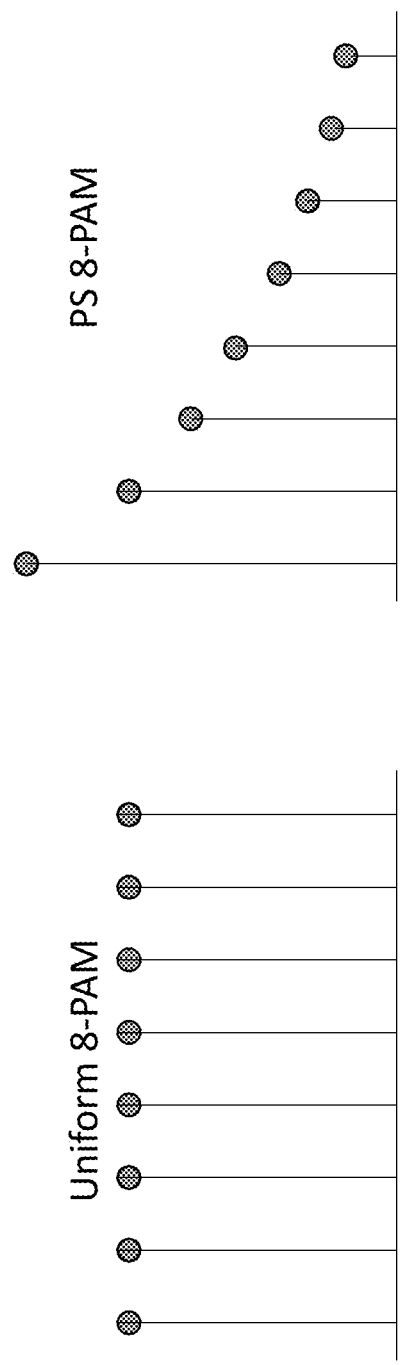

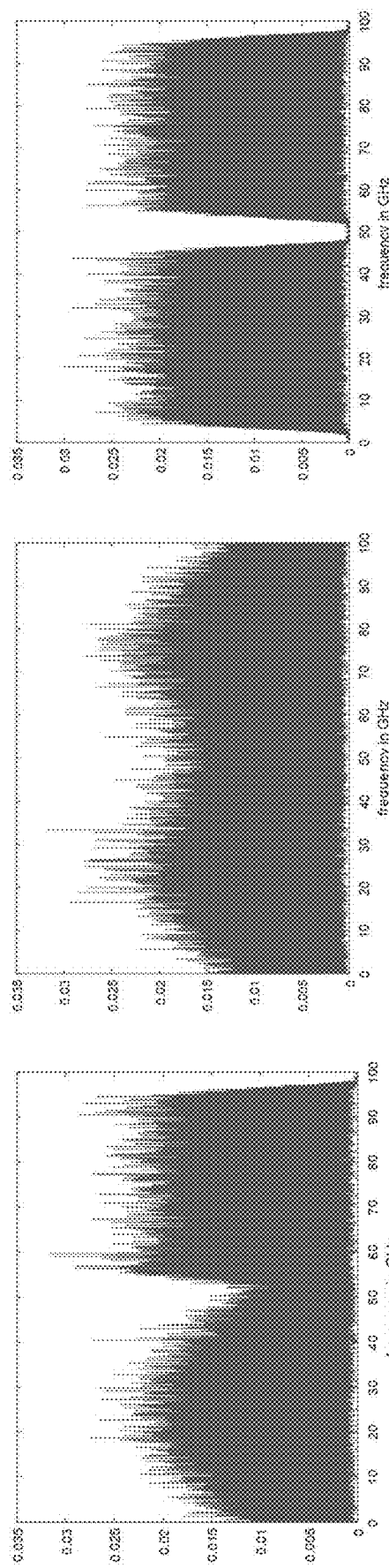

METHODS AND APPARATUS FOR OPTICAL COMMUNICATIONS VIA PULSE AMPLITUDE MODULATION (PAM) IN DENSE WAVELENGTH-DIVISION MULTIPLEXING (DWDM) SYSTEMS

CROSS-REFERENCE TO RELATED APPLICATION

This application is a non-provisional of and claims priority under 35 U.S.C. § 119 to U.S. provisional application No. 62/840,619, filed Apr. 30, 2019, and entitled "Methods and Apparatus for Optical Communications Via Pulse Amplitude Modulation (PAM) in Dense Wavelength-Division Multiplexing (DWDM) Systems," the disclosure of which is incorporated herein by reference in its entirety.

FIELD

One or more embodiments relate to apparatus and methods of optical communications via pulse amplitude modulation (PAM).

BACKGROUND

Coherent optical communications can employ a variety of spectrally efficient modulation formats, such as M-ary phase-shift keying and quadrature-amplitude modulation (QAM), relying upon stable carrier-phase estimation in the digital domain. The phase information of signals in coherent optical communications is also preserved after detection, thereby allowing equalizing linear transmission impairments via digital signal processing (DSP). As a result, coherent optical communications can achieve high capacity and are considered a promising technology for modern data center networks. Coherent optical communications, however, also suffer from several drawbacks, including high cost, high power consumption, and implementation complexity.

Pulse amplitude modulation (PAM), in contrast, does not involve coherent detection and therefore has low cost, low power consumption, and relatively straightforward implementation. To fully explore the potential of PAM in data center networks, however, a few challenges remain to overcome. For example, the coarse entropy granularity of existing M-PAM (M=2, 4, 8, etc.) is usually not sufficient to meet the dynamic bandwidth demands. In addition, a large capacity gap also exists between uniform M-QAM/PAM formats and the Shannon limit. Furthermore, the low spectral efficiency of the intensity modulation/direct detection (IM/DD) solution can restrict the throughput of the modern dense wavelength division multiplexing (DWDM) data center networks.

SUMMARY

Some embodiments described herein relate generally to optical communications via pulse amplitude modulation (PAM), and, in particular, to methods and apparatus for optical communications via PAM and Nyquist shaping in dense wavelength division multiplexing (DWDM) systems. In some embodiments, a method includes modulating a digital signal via pulse amplitude modulation (PAM) and applying Nyquist shaping to the digital signal to generate a filtered digital signal. The method also includes converting the filtered digital signal into an analog signal and transmitting the analog signal in an optical communication channel via a dense wavelength division multiplexing (DWDM) scheme.

In some embodiments, an apparatus includes a modulator configured to encode binary data into a digital signal via pulse amplitude modulation (PAM). The apparatus also includes a digital filter operatively coupled to the modulator and configured to apply Nyquist shaping to the digital signal. A digital to analog converter (DAC) is operatively coupled to the modulator and the filter. The DAC is configured to convert the digital signal to an analog signal and send the analog signal into an optical communication channel using a dense wavelength division multiplexing (DWDM) scheme.

In some embodiments, a system includes a transceiver and a monitor. The transceiver is configured to transmit an analog signal into an optical communication channel via a dense wavelength division multiplexing (DWDM) scheme. The transceiver includes a modulator configured to encode binary data into a digital signal via N-ary pulse amplitude modulation (PAM), N being an integer equal to or greater than 4. A distribution matcher (DM) is operatively coupled to the modulator and configured to apply probabilistic shaping to the digital signal. A filter is operatively coupled to the modulator and the DM. The filter is configured to apply Nyquist shaping to the digital signal after the DM. The transceiver also includes a digital to analog converter (DAC) operatively coupled to the modulator, the filter, and the DM. The DAC is configured to convert the digital signal to the analog signal. The transceiver further includes a controller operatively coupled to the modulator, the filter, and the DM. The monitor is operatively coupled to the optical communication channel and the transceiver. The monitor is configured to measure an optical signal to noise ratio (OSNR) of the optical communication channel during transmission of the analog signal. The controller is configured to: cause the DM to change a number of bits per symbol in the digital signal or to cause the filter to change an ROF of the Nyquist shaping based on the OSNR of the optical communication channel.

BRIEF DESCRIPTION OF THE DRAWINGS

The drawings primarily are for illustration purposes and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

FIGS. 3A and 3B show distribution functions of constellation points in a uniform PAM-8 scheme and an exponential PAM-8 scheme, respectively, according to an embodiment.

FIGS. 10A-10C show frequency responses of neighboring wavelength division multiplexing (WDM) channels using different roll-off factors (ROFs) of Nyquist shaping over the neighboring channels, according to an embodiment.

DETAILED DESCRIPTION

Figure 1:
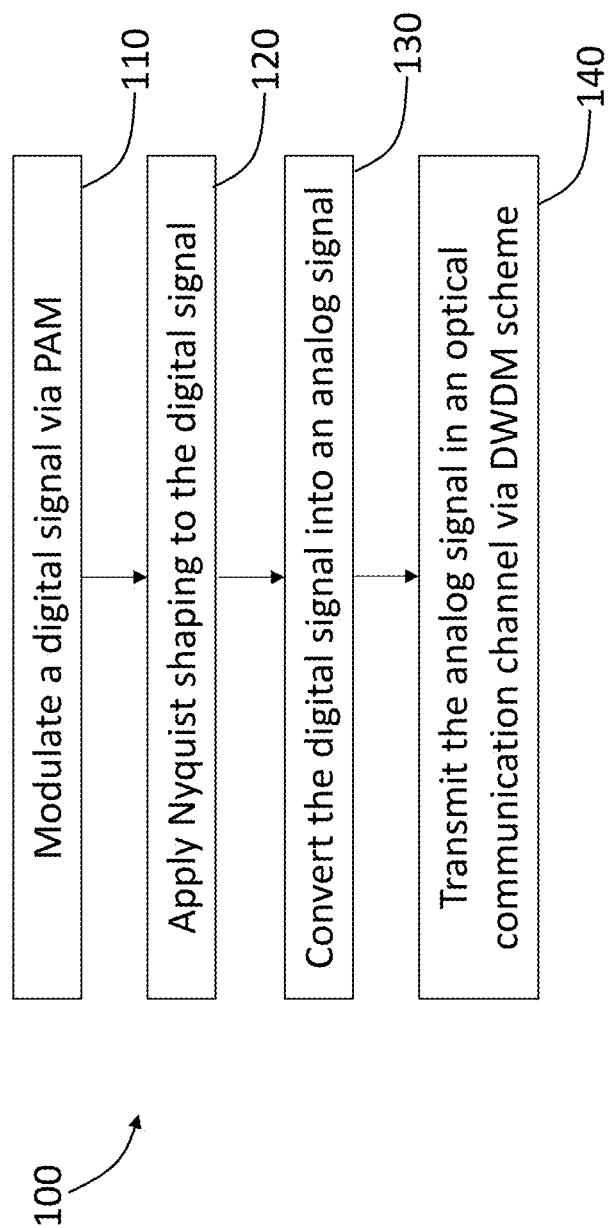
FIG. 1 shows a flowchart illustrating a method of optical communication via pulse amplitude modulation (PAM), according to an embodiment.

In some embodiments, a method includes modulating a digital signal via pulse amplitude modulation (PAM) followed by applying Nyquist shaping to the digital signal to generate a filtered digital signal. The filtered digital signal is then converted into an analog signal for transmission in an optical communication channel via a dense wavelength division multiplexing (DWDM) scheme. The Nyquist shaping can improve the spectral efficiency (e.g., decrease the spacing between adjacent wavelengths in DWDM) and reduce inter-channel crosstalk of the optical communication channel. As a result, Nyquist shaping can decrease the bandwidth used for transmitting a given signal or equivalently increase the capacity of a given channel.

Conventionally, in intensity modulation/direct detection (IM/DD) systems, spectral efficiency was not regarded by the industry as an important factor, given that the total channel capacity is less than 1 Tb/s in most cases. In other words, few wavelength channels with large channel spacing were used, so the industry didn't have to reduce the signal bandwidth. In data center networks, however, the demand for bandwidth is usually very high. Coherent communications may offer the bandwidth, but the cost and power consumption can be prohibitive. Inventors herein realize the promising potential of PAM based IM/DD solutions to provide a great trade-off between capacity, cost, power consumption, and footprint. In this solution for large capacity communication, more wavelength channels are used and Nyquist shaping now is employed to reduce inter-channel crosstalk.

In some embodiments, the PAM includes an N-ary PAM, where N is an integer equal to or greater than 4. For example, the PAM can be PAM-4, PAM-8, or even higher order PAMs.

In some embodiments, the Nyquist shaping is implemented by a digital filter, such as a square-root raised cosine filter or a raised cosine filter. The digital filter can have a roll-off factor (ROF) adjustable between 0 and 1. In some embodiments, the ROF of the digital factor during use can be substantially equal to or less than 0.5.

In some embodiments, before applying the Nyquist shaping, the digital signal undergoes probabilistic shaping, such as a Maxwell-Boltzmann distribution or an exponential distribution. The probabilistic shaping can be performed by a distribution matcher (DM), which can change the number of bits per symbol in the digital signal (also referred to as entropy).

In some embodiments, a forward error correction (FEC) code is applied to the digital signal after the probabilistic shaping and before the Nyquist shaping. In some implementations, the FEC includes a low-density parity-check (LDPC) code. The FEC can be implemented by an encoder at an adjustable code rate (e.g., between 0 and 1).

In some embodiments, the digital signal is processed within a transceiver (e.g., Nyquist shaping, probabilistic shaping, and FEC), and one or more properties of the optical communication channel are measured and employed to adjust operations of the transceiver that sends the analog signal. For example, an OSNR monitor can be used to measure the optical signal to noise ratio (OSNR) or chromatic dispersion level of the optical communication channel. Based on the measurement, the transceiver can change one or more of its operation parameters, including the ROF of the Nyquist shaping, the code rate of the FEC, and the number of bits per symbol in probabilistic shaping. In this manner, the different processing mechanisms (e.g., Nyquist shaping, probabilistic shaping, and FEC) can be systematically optimized.

FIG. 1 shows a flowchart illustrating a method 100 of optical communication via pulse amplitude modulation (PAM), according to an embodiment. The method 100 includes, at 110, modulating a digital signal via PAM, such as PAM-4, PAM-8, or higher order PAMs. At 120, Nyquist shaping (also referred to as Nyquist pulse shaping or NPS) is applied to the modulated digital signal to generate a filtered digital signal. The method 100 also includes, at 130, converting the filtered digital signal into an analog signal and transmitting the analog signal, at 140, in an optical communication channel via a DWDM scheme.

As described herein, the Nyquist shaping at 120 can improve the spectral efficiency and reduce inter-channel crosstalk or inter-symbol interference (ISI) in optical communications. For example, Nyquist shaping can provide an almost rectangular shape frequency response and therefore reduce the channel spacing.

In some embodiments, the Nyquist shaping can be implemented by a digital filter such as a raised-cosine (RC) filter. Without being bound by any particular theory or mode of operation, the frequency response of a RC filter can be written as:

$$H_{RC}(\omega) = \begin{cases} T_s & 0 \leq |\omega| < \pi(1 - ROF)/T_S \\ \frac{T_S}{2}\left(1 - \sin\left[\frac{T_s}{2 \times ROF}\left(|\omega| - \frac{\pi}{T_s}\right)\right]\right), & \pi(1 - ROF)/T_S \leq |\omega| < \pi(1 + ROF)/T_S \\ 0 & |\omega| > \pi(1 + ROF)/T_S \end{cases} \quad (1)$$

where ROF is the roll-off factor (ROF) of the RC filter, ω is the angular frequency, and $T_s$ is the symbol duration. In some embodiments, the Nyquist shaping can be implemented by a square-root raised cosine (SRRC) filter, and the frequency response of an SRRC filter can be written as $H_{SRRC}(\omega) = \sqrt{H_{RC}(\omega)}$.

In some embodiments, the ROF of the digital filter implementing the Nyquist shaping is adjustable (e.g., between 0 and 1, with ROF=1 indicating no Nyquist shaping and ROF=0 indicating the strongest shaping). Generally, a smaller ROF can provide a frequency response that is closer to a square shape and therefore tends to allow for reduced channel spacing. On the other hand, however, a smaller ROF may also increase the memory length and complexity in constructing the digital filter. In some embodiments, the ROF used in the method 100 can be substantially equal to or less than 0.5 (e.g., about 0.5, about 0.4, about 0.3, about 0.2, about 0.1, or less, including any values and sub ranges in between).

In some embodiments, the Nyquist shaping is implemented in electrical domain, i.e., the Nyquist shaping is applied to the digital signal before the digital signal is converted into the analog signal. In electrical domain, it is generally more convenient to generate an arbitrary ROF so as to optimize (or improve) the transmission of the system. In some embodiments, the Nyquist shaping can be implemented in optical domain, i.e., the Nyquist shaping is applied to the optical signal after the digital to analog conversion.

Figures 2A, 2B:
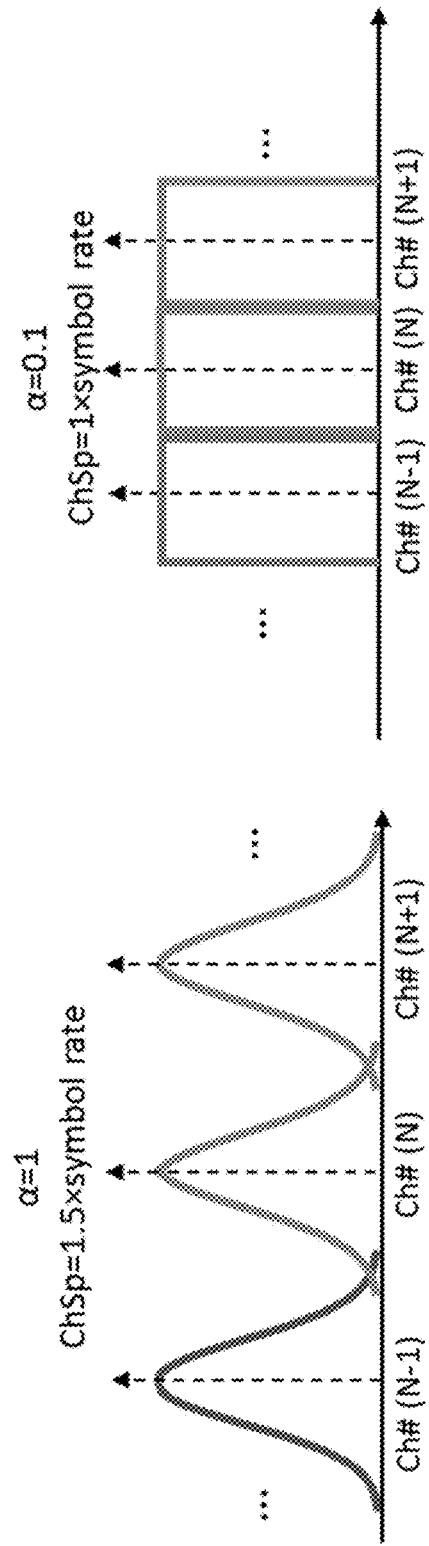
FIGS. 2A and 2B show frequency responses of two Nyquist filters having an ROF of 1 and 0.1, respectively, according to an embodiment.

FIGS. 2A and 2B show frequency responses of two SRRC Nyquist filters having an ROF of 1 and 0.1, respectively, according to an embodiment. As seen in FIG. 2B, the digital filter with ROF=0.1 has a nearly square frequency response. In contrast, the digital filter having an ROF=1 as shown in FIG. 2A provides little shaping to incident pulses.

In some embodiments, the method 100 further includes applying probabilistic shaping (PS) to the digital signal before the Nyquist shaping. In probabilistic shaping, symbols having lower amplitudes are transmitted with a higher probability, thereby decreasing the total power consumption (i.e., more power efficient). In addition, probabilistic shaping can also decrease the sensitivity to noise and therefore increase the channel capacity and reduce the gap to Shannon limit.

Several distribution schemes can be employed to apply the probabilistic shaping to the digital signal. In some deployments, the probabilistic shaping can be applied using a Maxwell-Boltzmann (MB) distribution. For MB distribution, the transmission probability of each constellation point $a_i$ can be written as:

$$P(a_i) = \exp(-\lambda \|a_i\|^2)/Z(\lambda), \lambda \geq 0 \quad (2)$$

where $\lambda$ is a scaling factor that is employed to adjust the entropy of the signal.

In some deployments, the probabilistic shaping can be applied using an exponential distribution. Exponential distribution can be suitable for intensity modulation with direct detection (IM/DD) schemes. In this scheme, the transmission probability of each constellation point $a_i$ can be written as:

$$P(a_i) = \exp(-\lambda \|a_i\|)/Z(\lambda), \lambda \geq 0 \quad (3)$$

In both Equations (2) and (3), the function $Z(\lambda)$ is employed to normalize the probability (i.e., ensure that the sum of probabilities of all constellation points in a symbol is one). The normalization function $Z(\lambda)$ can be defined as:

$$Z(\lambda) = \Sigma_i \exp(-\lambda \|a_i\|^2), \lambda \geq 0 \quad (4)$$

FIGS. 3A and 3B show the distribution functions of constellation points in a uniform PAM-8 scheme and an exponential PAM-8 scheme, respectively, as a function of optical signal amplitude according to an embodiment. As can be seen in FIG. 3B, as the amplitude of the constellation point increases, the transmission probability of the constellation point decreases exponentially.

In some embodiments, the method 100 also includes applying a forward error correction (FEC) code to the digital signal (e.g., before the Nyquist shaping at 120 and after the probabilistic shaping). In some deployments, the FEC includes a hard decision FEC, in which the corresponding receiver decides between 1 or 0 depending on whether the received signal level is above or below a certain threshold level, i.e., the decision rules are based on only two levels 0 and 1. In some deployments, the FEC includes a soft decision FEC, in which the receiver takes into account an additional confidence factor to decide between 1 and 0. For example, the confidence factor can be measured by the distance between the signal level and 1 or 0, and this approach can result in an additional coding gain of about 1 to 2 db and accordingly an overall improvement of about 20% to 40% for distance reachability (i.e., the distance of communication).

In some embodiments, the FEC includes a low-density parity-check (LDPC) code, which is a linear error correcting code that can transmit a message over a noisy transmission channel. LDPC codes are capacity-approaching codes and allow the noise threshold to be close to the Shannon limit. As a result, the combination of PS distribution and LDPC code can significantly improve the reliability of the resulting optical communication. In some embodiments, the FEC is implemented by an encoder having an adjustable code rate. The encoder can adjust the code rate based at least in part on the status of the optical communication channel.

In some embodiments, the method 100 also includes monitoring an attribute of the optical communication channel during transmission of the analog signal and adjusting the operation of the transceiver based at least in part on the measured attribute. In some deployments, the method 100 measures the OSNR of the optical communication channel using an in-service, in-band, real-time optical signal to noise ratio (OSNR) monitor. When the measured OSNR is satisfactory (e.g., above a given predefined value or preset value), the transceiver can then decrease the ROF of the digital filter applying the Nyquist shaping so as to decrease the bandwidth used for transmitting the analog signal. Accordingly, more wavelength channels can be established within the optical communication channel, thereby increasing the aggregate capacity of the optical communication channel.

In some deployments, the transceiver can also increase the code rate of the FEC in response to the OSNR being greater than a given value. In some deployments, the transceiver can increase the number of bits per symbol during probabilistic shaping. These adjustments can similarly increase the aggregate capacity of the optical communication channel.

In some deployments, in response to the OSNR being greater than a given value, the transceiver can make more than one adjustment so as to optimize (or improve) the system performance. For example, the transceiver can decrease the ROF and increase the FEC code rate. In another example, the transceiver can increase the number of bits per symbol and decrease the ROF. Any other combination of adjustments can also be employed.

In some deployments, in response to the measured OSNR being below a given value, the transceiver can make one or more of the following adjustments: increasing the ROF during Nyquist shaping, decreasing the FEC code rate, and/or decreasing the number of bits per symbol.

In some implementations, the method 100 includes measuring the chromatic dispersion level of the optical communication channel and then adjusting the operation of the digital filter, the DM, and/or the encoder based on the measured chromatic dispersion level. In some embodiments, in response to the chromatic dispersion level being greater than a preselected threshold value, the transceiver can decrease the ROF during Nyquist shaping, decrease the FEC code rate, and/or decrease the number of bits per symbol. In some deployments, in response to the chromatic dispersion level being less than a threshold value, the transceiver can increase the ROF during Nyquist shaping, increase the FEC code rate, and/or increase the number of bits per symbol.

Figure 4:
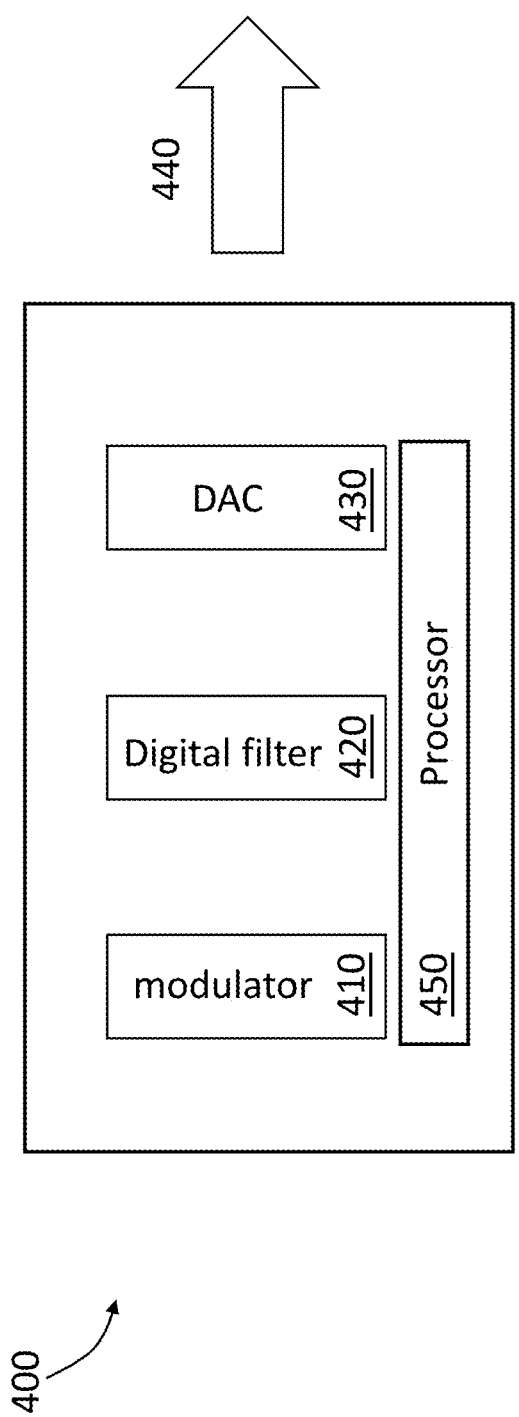
FIG. 4 shows a schematic of an apparatus for optical communication via PAM, according to an embodiment.

FIG. 4 shows a schematic of an apparatus 400 for optical communication via PAM, according to an embodiment. The apparatus 400 (e.g., a transmitter, or a transceiver) includes a modulator 410 configured to encode binary data into a digital signal PAM, such as PAM-4, PAM-8, or higher order PAMs. A digital filter 420 is operatively coupled to the modulator 410 and configured to apply Nyquist shaping to the digital signal. The apparatus 400 also includes a digital to analog converter (DAC) 430 operatively coupled to the modulator 410 and the digital filter 420. The DAC 430 is configured to convert the digital signal to an analog signal and send the analog signal into an optical communication channel 440 (e.g., an optical fiber) using a dense wavelength division multiplexing (DWDM) scheme.

In some implementations, the digital filter 420 includes raised cosine filter. In some implementations, the digital filter 420 includes a square-root raised cosine filter. In some implementations, the ROF of the digital filter 420 is adjustable. In some implementations, the digital filter 420 is configured to apply the Nyquist shaping at a roll-off factor (ROF) substantially equal to or less than 0.5.

In some implementations, the apparatus 400 further includes a DM (not shown in FIG. 4; see, e.g., FIG. 5 and FIG. 6) operatively coupled to the modulator 410. The DM is configured to apply probabilistic shaping to the digital signal before the digital filter 420 (e.g., the DM can be placed between the modulator 410 and the digital filter 420). In some implementations, the probabilistic shaping includes a Maxwell-Boltzmann distribution or an exponential distribution.

In some implementations, the apparatus 400 further includes an encoder (not shown in FIG. 4; see, e.g., FIG. 5 and FIG. 6) operatively coupled to the modulator 410. The encoder is configured to apply a low-density parity-check (LDPC) code to the digital signal before the digital filter 420 (e.g., the encoder can be disposed between the modulator 410 and the digital filter 420).

As shown in FIG. 4, the apparatus 400 further includes a controller 450 operatively coupled to the digital filter 420. The controller 450 is configured to receive information representing an optical signal to noise ratio (OSNR) or a chromatic dispersion level of the optical communication channel 440 measured during transmission of the analog signal. Based at least in part on the received information, the controller 450 can control the digital filter 420 to change the ROF of the Nyquist shaping. For example, when the OSNR is greater than a predefined or preselected threshold value, the controller 450 can control the digital filter 420 to decrease the ROF so as to increase the aggregate capacity of the optical communication channel 440. In another example, in response to the chromatic dispersion level greater than a predefined or preselected threshold value, the controller 450 can control the digital filter 420 to decrease the ROF.

In some implementations, the controller 450 is configured to control the DM to change the number of bits per symbol in response to the received information about the optical communication channel 440. For example, in response to the OSNR being greater than a predefined or preselected threshold value, the controller 450 can control the DM to increase the number of bits per symbol. In another example, in response to the chromatic dispersion level greater than a predefined or preselected threshold value, the controller 450 can control the DM to decrease the number of bits per symbol.

In some embodiments, the controller 450 is configured to control the encoder to change the code rate of the FEC in response to the received information about the optical communication channel 440. For example, in response to the OSNR being greater than a predefined or preselected threshold value, the controller 450 can control the encoder to increase the FEC code rate. In another example, in response to the chromatic dispersion level greater than a predefined or preselected threshold value, the controller 450 can control the encoder to decrease the FEC code rate.

Figure 5:
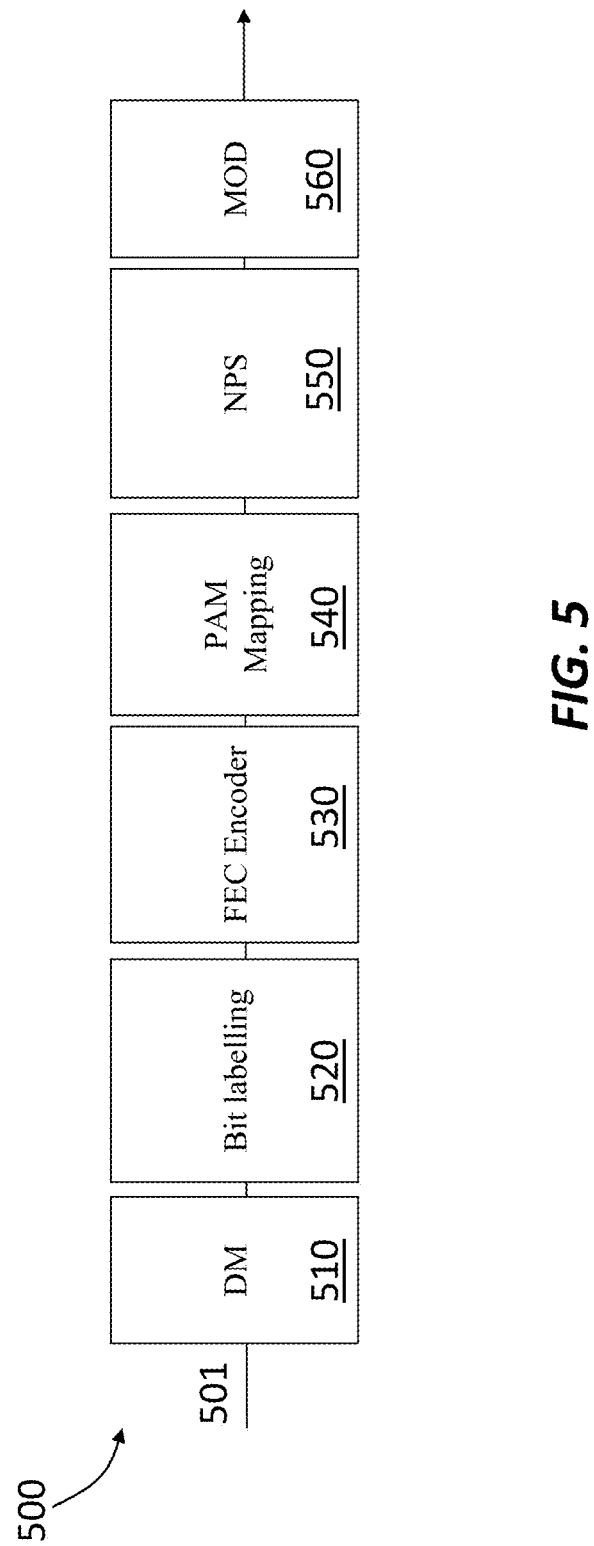
FIG. 5 shows a schematic of a transceiver for optical communication via probabilistic shaping (PS) PAM, according to an embodiment.

FIG. 5 shows a schematic of an apparatus 500 for optical communication via PS PAM, according to an embodiment. The apparatus 500 includes a DM 510 to receive a digital signal 501 modulated in a PAM scheme and to apply probabilistic shaping to the digital signal 501. As described herein, the probabilistic shaping can include a Maxwell-Boltzmann distribution or an exponential distribution. In addition, the DM 510 is also configured to change the number of bits per symbol depending on the status of the optical communication channel.

A bit labeler 520 is operatively coupled to the DM 510 to constrain (or control) bits of the digital signal for a particular property. In a PAM signal, a signal constellation usually provides a set of possible symbols that are to be transmitted, and the symbols correspond to codewords output from an encoder. In some embodiments, the bit labeling includes gray-code labeling, in which neighboring signal points differ in exactly one bit position.

The apparatus 500 also includes an encoder 530 operatively coupled to the bit labeler 520 so as to apply forward error correction (FEC) to the digital signal after bit labeling. As described herein, the encoder 530 can adjust the FEC code rate in response to the status of the optical communication channel. After the encoder 530, a PAM mapper 540 is configured to map bits into symbols for the digital signal.

A digital filter 550 is operatively coupled to the PAM mapper 540 and employed to apply Nyquist shaping to the digital signal after the PAM mapper 540. The digital filter 550 has an adjustable ROF and is configured to change the ROF of the Nyquist shaping in response to the status of the optical communication channel. An optical modulator 560 is operatively coupled to the digital filter 550 to convert the digital signal into an optical signal for subsequent transmission.

Figure 6:
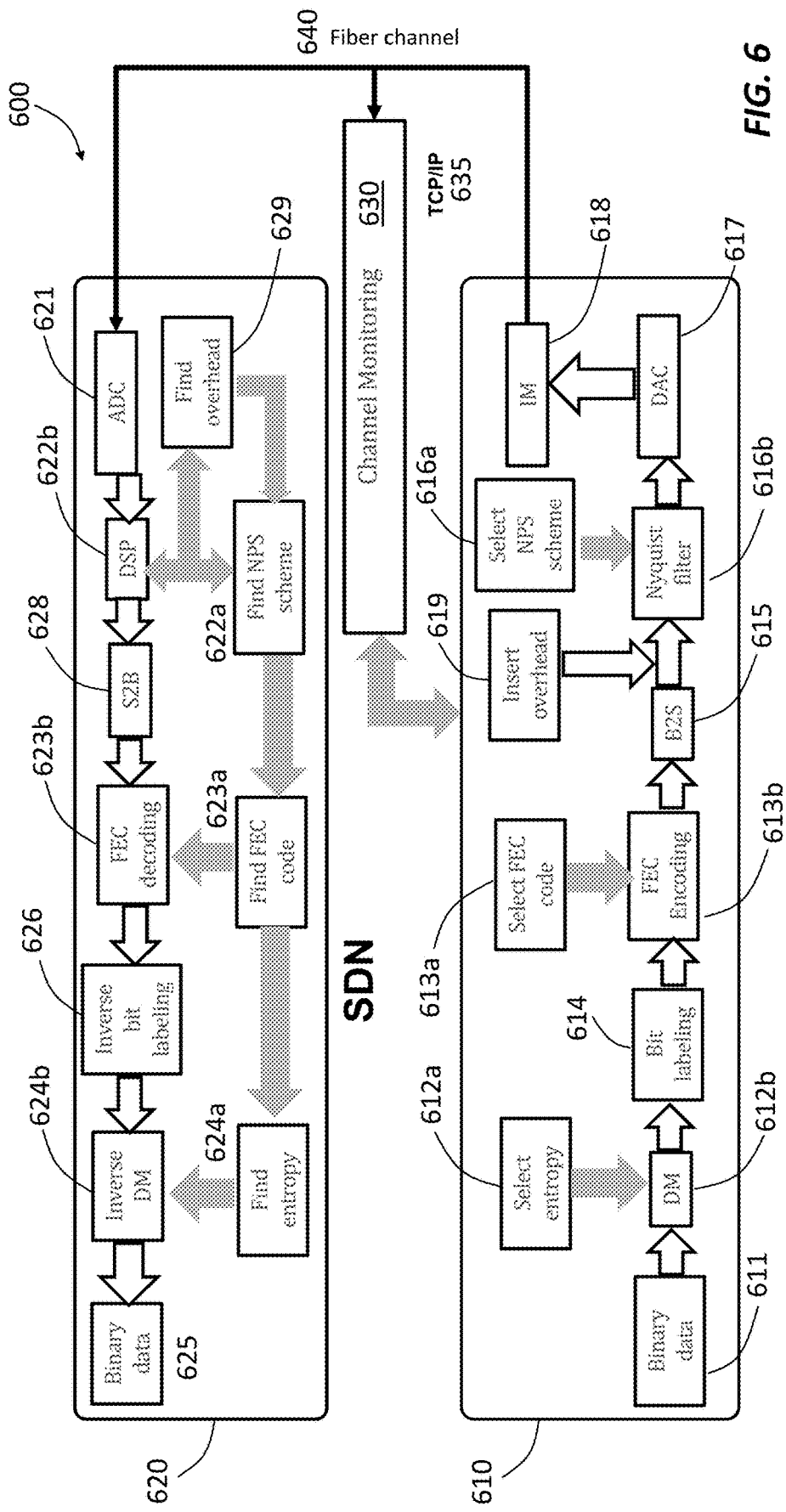
FIG. 6 shows a schematic of a system for optical communication via PS PAM, according to an embodiment.

FIG. 6 shows a schematic of a system 600 for optical communication via PS PAM, according to an embodiment. The system 600 includes a first transceiver 610, a second transceiver 620, a fiber channel 640 for optical communication between the first transceiver 610 and the second transceiver 620, and a monitor 630 to monitor the status of the fiber channel 640. For illustrative purposes only, the first transceiver 610 is used as a transmitter and the second transceiver 620 is used as a receiver in FIG. 6.

The first transceiver 610 includes a DM 612b to apply probabilistic shaping to a digital signal 611 including binary data. A selector 612a is employed to select the desired entropy. A labeler 614 is operatively coupled to the DM 612b to perform bit to symbol mapping. A first encoder 613b is operatively coupled to the labeler 614 to apply forward error correction (FEC) to the digital signal, and a selector 613a is employed to select the desired FEC code and/or code rate. The encoded digital signal is then sent to a mapper 615 that is configured to map bits into symbols. The first transceiver 610 also includes a digital filter 616b to apply Nyquist shaping to the digital signal after the mapper 615, and a digital to analog converter (DAC) 617 is then configured to convert the digital signal into an analog signal. Between the mapper 615 and the digital filter 616b, overhead 619 is inserted into the digital signal. In addition, a selector 616a is also employed to select the desired Nyquist shaping scheme. An intensity modulator 618 then modulates the analog signal for optical transmission in the fiber channel 640.

The second transceiver 620 includes an analog to digital converter (ADC) 621 to convert the analog signal received from the fiber channel 640 into a digital signal, and a digital signal processor (DSP) 622b is employed to process the digital signal (e.g., recovering the signal). In addition, overhead information 629 is also retrieved and used in subsequent processing. The overhead information is sent to a reader 622a to find out the scheme of the Nyquist shaping that is used in the received signal and facilitate the DSP 622b to recover the signal. The overhead information 629 is also sent to a second reader 623a to retrieve the scheme of the FEC coding and facilitate a decoder 623b to inverse decode the FEC codes. Furthermore, the overhead information 629 is employed by a reader 624a to find out the entropy information and facilitate an inverse DM 624b to perform inverse probabilistic shaping so as to recover the binary data 625. Between the DSP 622b and the decoder 623b, a mapper 628 is employed to map symbol to bits. In addition, between the decoder 623b and the inverse DM 624b, an inverse labeler 626 is employed to perform inverse labeling.

The monitor 630 is configured to monitor the status of the fiber channel 640 and then transmit the status information (e.g., OSNR or chromatic dispersion level) to the first transceiver 610. The transmission between the monitor 630 and the first transceiver 610 can be conducted via a signal 635 formatted according to, for example, TCP/IP protocol.

Upon receiving the status information, the first transceiver 610 adjusts one or more operation parameters so as to optimize the transmission in the fiber channel 640. As described herein, the first transceiver 610 can adjust one or more of the following parameters: the number of bits per symbol via the DM 612b, the code rate of FEC via the first encoder 613b, and the ROF of Nyquist shaping via the digital filter 616b.

In some implementations, the configuration of the first transceiver 610 can be represented by three parameters: the number of bits per symbol (also referred to as entropy), the FEC code rate, and the ROF of the Nyquist shaping. In some implementations, the configuration information can be represented in the format (entropy, code rate, ROF) and can be further encoded in the signal as an option-indicator to facilitate the receiver to retrieve information in the received signals.

In some embodiments, for a given capacity, other parameters of the first transceiver 610 can be determined as following. In these embodiments, the performances of M-PAM formats are compared under the same capacity, which can be defined as $C=H(p)-m(1-R)$, where $H(p)$ represents the entropy of the PS-MPAM, R is the FEC code rate, $m=\log_2(M)$, and M is the order of the PAM modulation.

For illustrative purposes only, three different capacities are considered here. In one example, the capacity is 2.7 b/s and PS is not used, and then the code rate can be 0.9, i.e. (3, 0.9) in the format of (entropy, code rate). In another example, the capacity is 2.4 b/s, the possible options can be (3, 0.8) and (2.7, 0.9). In yet another example, the capacity is 2.1 b/s, and the options can be (3, 0.7), (2.7, 0.8), and (2.4, 0.9). In these examples, three different PS schemes have an entropy of 2.4, 2.7, and 3, respectively. There are also three FEC coding schemes having a code rate of 0.7, 0.8, and 0.9, respectively. Also for illustrative purposes only, three Nyquist shaping schemes can be used, resulting in 18 configurations in the format of (entropy, code rate, ROF).

On the receiving end, the second transceiver 620 has three types of inverse PS schemes corresponding to the three PS schemes in the first transceiver 610. Similarly, the second transceiver 620 also has three types of FEC decoding schemes in the decoder 623 and three types of matched filter schemes in the DSP 622. Because 18 different configurations exist, at least 5 bits overhead are used as the indicator and encoded in the signal send to the second transceiver 620.

Once the second transceiver 620 detects the indicator, the second transceiver 620 switches the DSP 622b to the corresponding ROF value, switches the decoder 623b to the corresponding code rate for decoding, and switches the DM 624b to the corresponding entropy for inverse PS.

Figure 7:
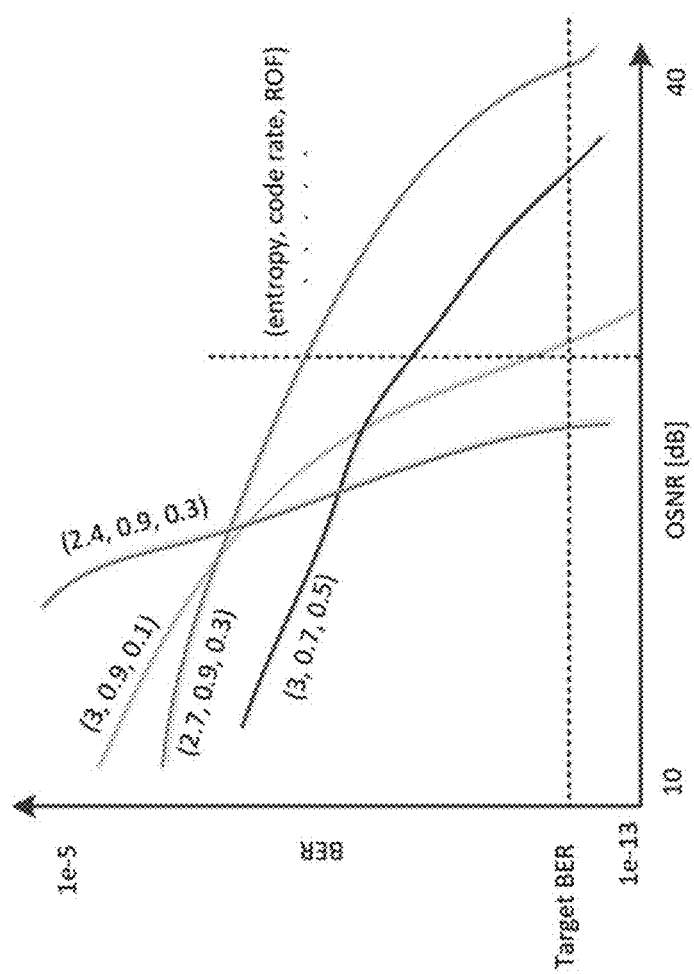
FIG. 7 shows bit error rate (BER) as a function of optical signal to noise ratio (OSNR) under different transmission configurations, according to an embodiment.

In some implementations, the system 600 can be employed to construct a data center network. In these implementations, for each configuration, the BER vs. OSNR curve can be measured. FIG. 7 shows BER as a function of OSNR under different transmission configurations, according to an embodiment. Once the curves in FIG. 7 are obtained and a target BER threshold is given (e.g., $1e^{-12}$), a user can select the (entropy, code rate, ROF) curve that provides the highest capacity at a certain measured OSNR value. In some embodiments, such selection can be automatically implemented by a controller. In some embodiments, the user can manually select the desired curve.

In some embodiments, an agile chart with a format of (OSNR, entropy, code rate, ROF) can be obtained. In the application of data center networks, the OSNR can be monitored and sent to the transmitter for adaptation according to the agile chart. The receiver is then switched to the corresponding options by the option-indicator symbols sent by the transmitter. As a result, a robust and high capacity data center network can be built.

More specifically, the agile chart can be produced based on the curves shown in FIG. 7. Out of several BER vs. OSNR curves in cases of different (entropy, code rate, ROF) combinations, one can find matched curves that can offer below-target BER performance at certain OSNR. From these matched curves, one can then choose the (entropy, code rate, ROF) combinations that can offer the highest capacity. If there are more than two combinations that can offer the highest capacity and also meet the BER performance at certain OSNR, one can then choose the one that has the lowest power consumption. The power consumptions of DM, FEC coding, and Nyquist shaping can vary along with different combinations of entropy, FEC code rate, and ROF. The agile chart can also include the power consumption of each (entropy, code rate, ROF) combination.

Figure 8:
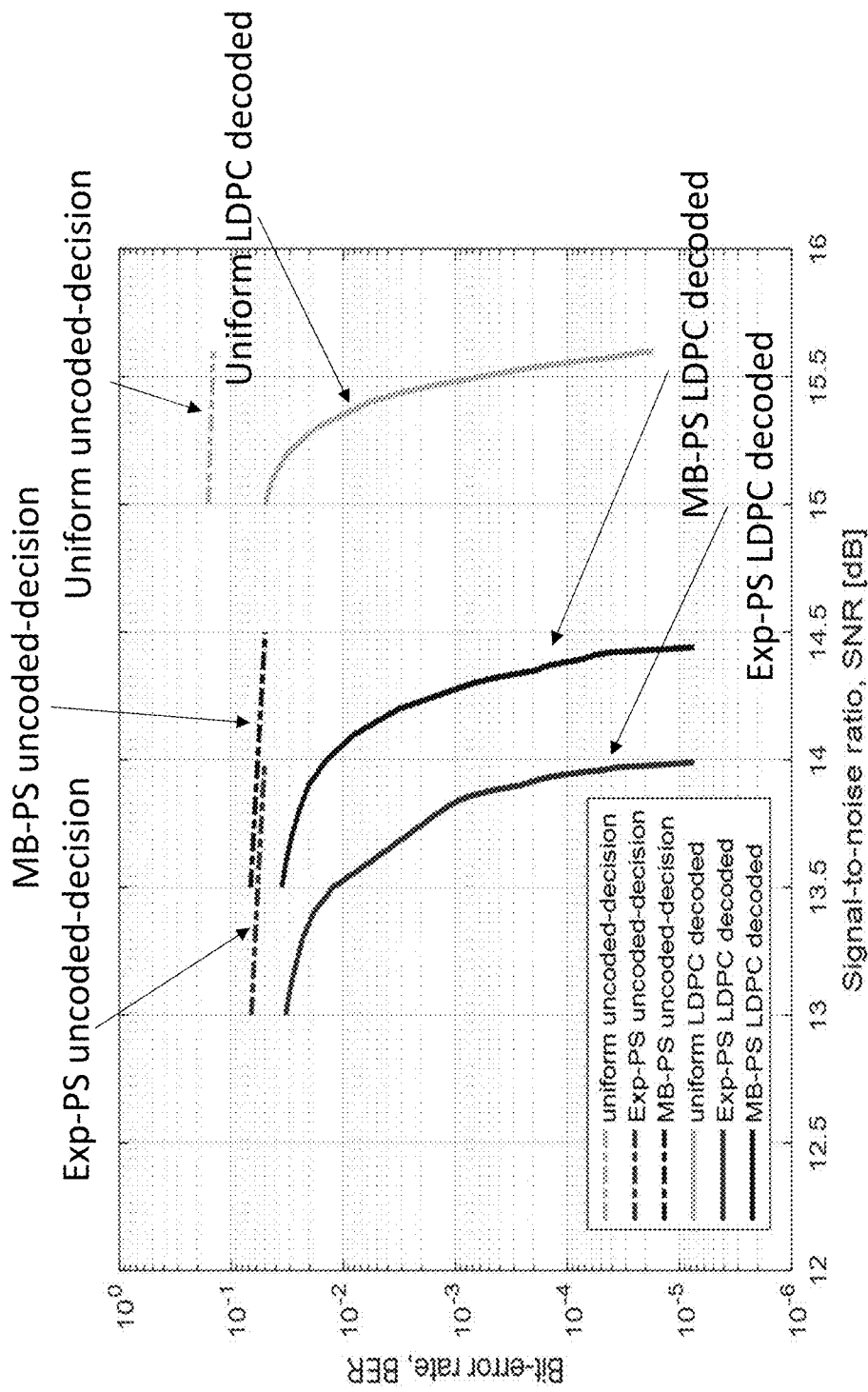
FIG. 8 shows BER as a function of OSNR in optical communications via PAM-8 using different PS schemes, according to an embodiment.

FIG. 8 shows BER as a function of OSNR in optical communications via PAM-8 using different PS schemes (i.e., Maxwell-Boltzmann and exponential distributions), according to an embodiment. FIG. 8 also compares the two PS distributions (labeled "Exp.-PS LDPC decoded" and "MB-PS LDPC decoded") with the uniform distribution (labeled "Uniform LDPC decoded"). In addition, the performance of LDPC coding is also illustrated. In FIG. 8, solid lines represent the BER performance of LDPC coded schemes, and dashed lines are BER performances without decoding. The significant improvement due to LDPC and exponential distribution can be readily observed in FIG. 8.

Figure 9:
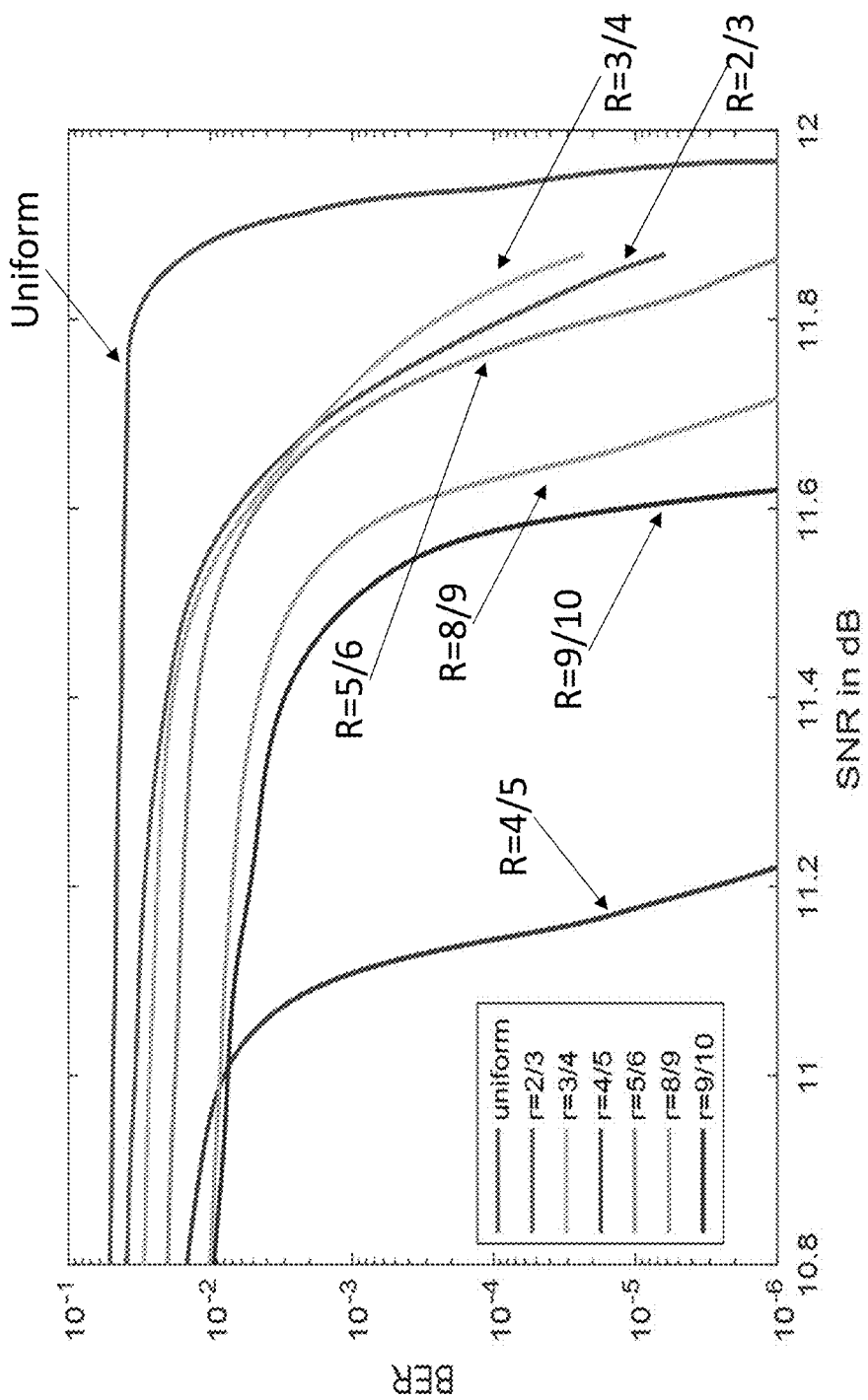
FIG. 9 shows BERs of optical communications as a function of signal-to-noise ratio (SNR) using different code rates of low-density parity-check (LDPC) codes, according to an embodiment.

FIG. 9 shows BERs of optical communications as a function of signal-to-noise ratio (SNR) using different code rates of low-density parity-check (LDPC) codes, according to an embodiment. It can be seen that all the PS distribution schemes outperform the uniform distribution scheme, and the optimal performance is achieved when the code rate is about 0.8.

FIGS. 10A-10C show frequency responses of neighboring wavelength division multiplexing (WDM) channels using different roll-off factors (ROFs) of Nyquist shaping over the neighboring channels, according to an embodiment. In FIG. 10A, the left channel has an ROF of 1 and the second channel has an ROF of 0.1. In FIG. 10B, the two channels have the same ROF of 1. In FIG. 10C, the two channels have the same ROF of 0.1. The baud rate for each channel is set at 25Gbaud, the sample rate is 4 samples/symbol, and the channel spacing is 50 GHz. It can be seen from FIGS. 10A-10C that a smaller ROF tends to achieve better spectral efficiency with a lower inter-channel crosstalk.

Figure 11B:
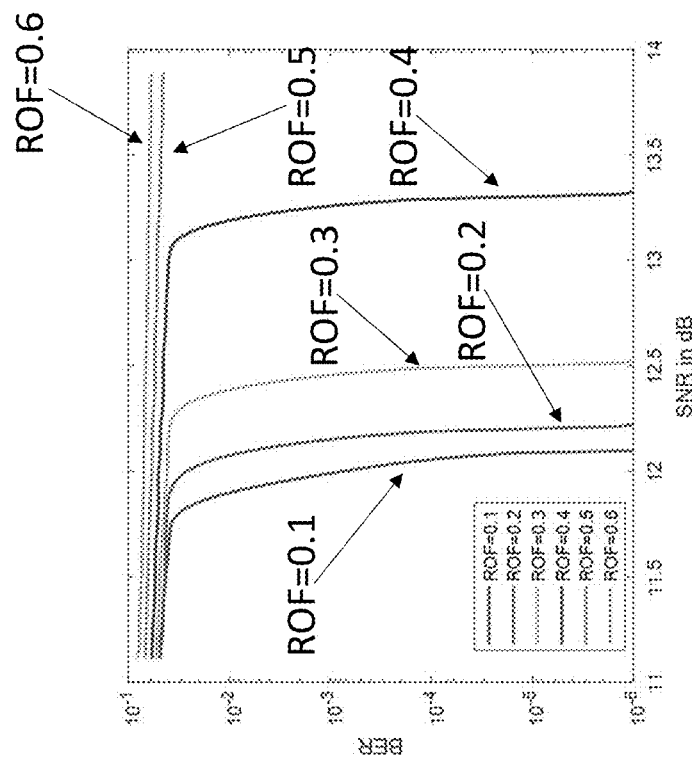
FIGS. 11A and 11B show BER performances at different ROFs using LDPC-coded uniform distribution and PS distribution, respectively, according to an embodiment.
Figure 11A:
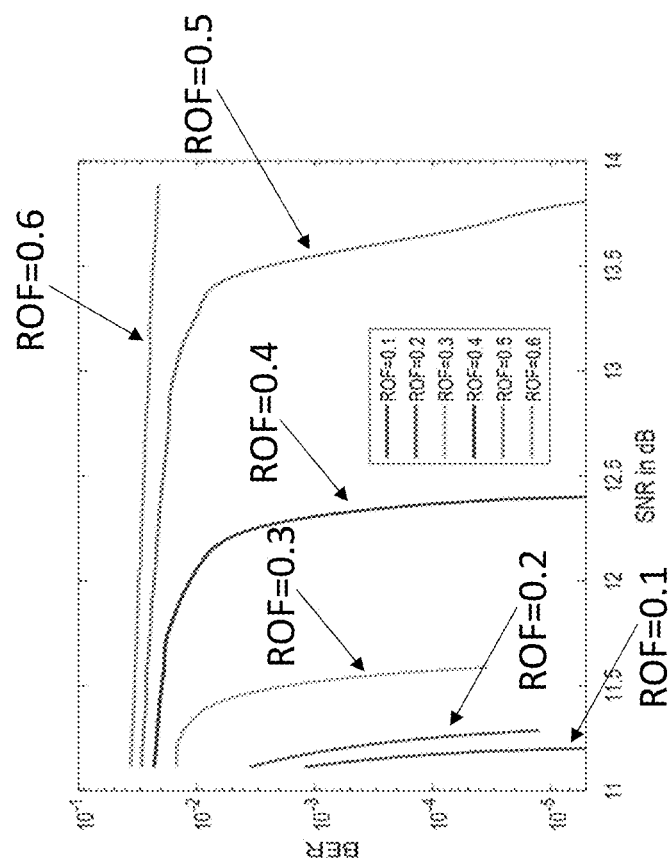

FIGS. 11A and 11B show BER performances at different ROFs using LDPC-coded uniform distribution and PS distribution, respectively, according to an embodiment. In both situations, a smaller value of ROF can lead to the frequency response of a rectangular shape, thereby improving the spectral efficiency, and at the same time improving the BER performance for the same SNR.

While various embodiments have been described and illustrated herein, a variety of other means and/or structures for performing the function and/or obtaining the results and/or one or more of the advantages described herein, and each of such variations and/or modifications are possible. More generally, all parameters, dimensions, materials, and configurations described herein are meant to be examples and the actual parameters, dimensions, materials, and/or configurations will depend upon the specific application or applications for which the disclosure is used. It is to be understood that the foregoing embodiments are presented by way of example only and that other embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

As used herein, a "module" can be, for example, any assembly and/or set of operatively-coupled electrical components associated with performing a specific function, and can include, for example, a memory, a processor, electrical traces, optical connectors, software (stored and executing in hardware) and/or the like.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
modulating a digital signal via pulse amplitude modulation (PAM) to generate a modulated digital signal;
transmitting the modulated digital signal through a distribution matcher (DM) configured to apply probabilistic shaping to the modulated digital signal;
applying Nyquist shaping to the modulated digital signal to generate a filtered digital signal;
converting the filtered digital signal into an analog signal; and
transmitting the analog signal in an optical communication channel via a dense wavelength division multiplexing (DWDM) scheme.

2. The method of claim 1, wherein the PAM includes an N-ary PAM, where N is an integer equal to or greater than 4.

3. The method of claim 1, wherein applying the Nyquist shaping to the modulated digital signal includes transmitting the modulated digital signal through a square-root raised cosine filter.

4. The method of claim 1, wherein applying the Nyquist shaping to the modulated digital signal includes applying the Nyquist shaping at a roll-off factor (ROF) substantially equal to or less than 0.5.

5. The method of claim 1, further comprising:
before applying the Nyquist shaping, applying to the modulated digital signal with the probabilistic shaping including at least one of a Maxwell-Boltzmann distribution or an exponential distribution.

6. The method of claim 1, further comprising:
before applying the Nyquist shaping, applying, to the modulated digital signal, a forward correction code (FEC) including a low-density parity-check (LDPC) code.

7. The method of claim 1, further comprising:
measuring at least one attribute of the optical communication channel during transmission of the analog signal, the at least one attribute of the optical communication channel including an optical signal to noise ratio (OSNR) or a chromatic dispersion level; and
changing an ROF of the Nyquist shaping applied to the modulated digital signal based on the at least one attribute of the optical communication channel.

8. The method of claim 1, further comprising:
measuring at least one attribute of the optical communication channel during transmission of the analog signal, the at least one attribute of the optical communication channel including an optical signal to noise ratio (OSNR) or a chromatic dispersion level; and
changing a number of bits per symbol in the modulated digital signal using the DM based on the at least one attribute of the optical communication channel.

9. The method of claim 1, further comprising:
applying an LDPC code to the modulated digital signal;
measuring at least one attribute of the optical communication channel during transmission of the analog signal, the at least one attribute of the optical communication channel including an optical signal to noise ratio (OSNR) or a chromatic dispersion level; and
changing at least one of a number of bits per symbol in the modulated digital signal using the DM, a code rate of the LDPC code, or an ROF of the Nyquist shaping based on the at least one attribute of the optical communication channel.

10. An apparatus, comprising:
a modulator configured to encode binary data into a digital signal via pulse amplitude modulation (PAM) to generate a modulated digital signal;
an encoder operatively coupled to the modulator and configured to apply a density parity-check (LDPC) code to the modulated digital signal;
a digital filter operatively coupled to the modulator and configured to apply Nyquist shaping to the modulated digital signal; and
a digital to analog converter (DAC) operatively coupled to the modulator and the digital filter, the DAC configured to convert the modulated digital signal to an analog signal and send the analog signal into an optical communication channel using a dense wavelength division multiplexing (DWDM) scheme.

11. The apparatus of claim 10, wherein the modulator is configured to encode the binary data using an N-ary PAM, where N is an integer equal to or greater than 4.

12. The apparatus of claim 10, wherein the digital filter includes a square-root raised cosine filter.

13. The apparatus of claim 10, wherein the digital filter is configured to apply the Nyquist shaping at a roll-off factor (ROF) substantially equal to or less than 0.5.

14. The apparatus of claim 10, wherein the digital filter has an adjustable ROF.

15. The apparatus of claim 10, further comprising:
a distribution matcher (DM) operatively coupled to the modulator, the DM configured to apply probabilistic shaping to the modulated digital signal before the digital filter, the probabilistic shaping including at least one of a Maxwell-Boltzmann distribution or an exponential distribution.

16. The apparatus of claim 10, further comprising:
a controller operatively coupled to the digital filter, the controller configured to receive information representing an optical signal to noise ratio (OSNR) or a chromatic dispersion level of the optical communication channel measured during transmission of the analog signal, the controller further configured to cause the digital filter to change an ROF of the Nyquist shaping based on the information.

17. The apparatus of claim 10, further comprising:
a DM operatively coupled to the modulator and the filter, the DM configured to apply probabilistic shaping to the modulated digital signal; and
a controller operatively coupled to the DM, the controller configured to receive information representing an OSNR or a chromatic dispersion level of the optical communication channel measured during transmission of the analog signal, the controller further configured to cause the DM to change a number of bits per symbol in the modulated digital signal based on the information.

18. The apparatus of claim 10, further comprising:
a DM operatively coupled to the modulator and the digital filter, the DM configured to apply probabilistic shaping to the modulated digital signal before the digital filter; and
a controller operatively coupled to the DM and the digital filter, the controller configured to receive information representing an OSNR or a chromatic dispersion level of the optical communication channel measured during transmission of the analog signal, the controller further configured to: cause the DM to change a number of bits per symbol in the modulated digital signal, cause the digital filter to change an ROF of the Nyquist shaping, or cause the encoder to change a code rate of the LDPC code, based on the information.

19. A system, comprising:
a transceiver configured to transmit an analog signal into an optical communication channel via a dense wavelength division multiplexing (DWDM) scheme, the transceiver including:
- a modulator configured to encode binary data into a digital signal via N-ary pulse amplitude modulation (PAM) to generate a modulated digital signal, N being an integer equal to or greater than 4;
- a distribution matcher (DM) operatively coupled to the modulator, the DM configured to apply probabilistic shaping to the modulated digital signal to generate a first shaped modulated digital signal;
- a filter operatively coupled to the modulator and the DM, the filter configured to apply Nyquist shaping to the first shaped modulated digital signal to generate a second shaped modulated digital signal;
- a digital to analog converter (DAC) operatively coupled to the modulator, the filter, and the DM, the DAC configured to convert the second shaped modulated digital signal to the analog signal; and
- a controller operatively coupled to the modulator, the filter, and the DM; and a monitor operatively coupled to the optical communication channel and the transceiver, the monitor configured to measure an optical signal to noise ratio (OSNR) of the optical communication channel during transmission of the analog signal, wherein the controller is configured to: cause the DM to change a number of bits per symbol in the modulated digital signal or to cause the filter to change an ROF of the Nyquist shaping based on the OSNR of the optical communication channel.

* * * * *